United States Patent
Cho (10) Patent No.: US 12,327,604 B2
(45) Date of Patent: Jun. 10, 2025

(54) SEMICONDUCTOR DEVICE AND METHOD OF OPERATING THE SAME CAPABLE OF PREVENTING MALFUNCTION DURING READ OPERATION

(71) Applicant: SK hynix Inc., Icheon-si (KR)

(72) Inventor: Byung Goo Cho, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 243 days.

(21) Appl. No.: 18/304,238

(22) Filed: Apr. 20, 2023

(65) Prior Publication Data

US 2024/0177748 A1    May 30, 2024

(30) Foreign Application Priority Data

Nov. 24, 2022  (KR) .................. 10-2022-0159402

(51) Int. Cl.
    *G11C 7/00*     (2006.01)
    *G11C 7/10*     (2006.01)

(52) U.S. Cl.
    CPC .......... *G11C 7/1069* (2013.01); *G11C 7/1063* (2013.01)

(58) Field of Classification Search
    CPC ....... G11C 7/1051; G11C 7/22; G11C 7/1072; G11C 7/1006; G11C 7/1066
    USPC ............................................. 365/204, 189.15
    See application file for complete search history.

(56) References Cited

U.S. PATENT DOCUMENTS 6,288,941 B1 *  9/2001  Seki .................. G11C 16/10
                                              365/185.11

FOREIGN PATENT DOCUMENTS

| KR | 101382563 B1 | 4/2014 |
| KR | 1020200109682 A | 9/2020 |

* cited by examiner

*Primary Examiner* — Son T Dinh
(74) *Attorney, Agent, or Firm* — WILLIAM PARK & ASSOCIATES LTD.

(57) ABSTRACT

A semiconductor device includes a chip selection signal receiver configured to receive, from an external memory controller, a chip selection signal activating to a state in which communication is possible with the external memory controller. The semiconductor device also includes a data signal receiver configured to receive a command and an address from the external memory controller. The semiconductor device further includes an operation controller configured to perform an internal operation according to the command and the address received through the data signal receiver while the chip selection signal is input. The semiconductor device additionally includes an internal signal generator configured to output an inactivated internal chip selection signal blocking transferal of the chip selection signal to the operation controller when a command other than a command requesting an output of data is received while the internal operation is performed.

20 Claims, 9 Drawing Sheets

FIG. 8

SEMICONDUCTOR DEVICE AND METHOD OF OPERATING THE SAME CAPABLE OF PREVENTING MALFUNCTION DURING READ OPERATION

CROSS-REFERENCE TO RELATED APPLICATION

The present application claims priority under 35 U.S.C. § 119(a) to Korean patent application number 10-2022-0159402 filed on Nov. 24, 2022, in the Korean Intellectual Property Office, the entire disclosure of which is incorporated by reference herein.

BACKGROUND

1. Technical Field

The present disclosure relates to an electronic device, and more particularly, to a semiconductor device and a method of operating the same capable of preventing a malfunction during a read operation.

2. Related Art

A memory system is a system that stores data under control of a host device such as a computer or a smartphone. The memory system may include a memory device in which data is stored and a memory controller controlling the memory device. The memory device may be classified as a volatile memory device or a nonvolatile memory device.

In a nonvolatile memory device in which memory cells are stacked in three dimensions, a time for initializing voltages provided when reading data stored in the memory cells may be long. Accordingly, the nonvolatile memory device may initialize the voltages provided to the memory cells while outputting the data stored in the memory cells to the memory controller to improve a response speed. However, the memory controller may not know whether the nonvolatile memory device is internally operating. Therefore, when the memory controller outputs a command while the nonvolatile memory device initializes the voltages, the nonvolatile memory device may malfunction.

SUMMARY

An embodiment of the present disclosure provides a semiconductor device and a method of operating the same capable of preventing malfunction of the semiconductor device that may occur when a command is received while a read operation is performed.

According to an embodiment of the present disclosure, a semiconductor device includes: a chip selection signal receiver configured to receive, from an external memory controller, a chip selection signal activating to a state in which communication is possible with the external memory controller; a data signal receiver configured to receive a command and an address from the external memory controller; an operation controller configured to perform an internal operation according to the command and the address received through the data signal receiver while the chip selection signal is input; and an internal signal generator configured to output an inactivated internal chip selection signal blocking transferal of the chip selection signal to the operation controller when a command other than a command requesting an output of data is received while the internal operation is performed.

According to an embodiment of the present disclosure, a method of operating a semiconductor device includes: receiving, from an external memory controller, a chip selection signal activating to a state in which communication is possible with an external memory controller; receiving a command and an address from the external memory controller; performing an internal operation according to the command and the address while the chip selection signal is input; and outputting an inactivated internal chip selection signal blocking transferal of the chip selection signal to an operation controller performing the internal operation when a command other than a command requesting an output of data is received while the internal operation is performed.

According to an embodiment of the present disclosure, a semiconductor device includes: memory cells; a peripheral circuit configured to perform a high-speed read operation of sensing data stored in the memory cells and discharging voltages provided to the memory cells while outputting the data to an external memory controller; and control logic configured to ignore a command other than a command requesting an output of the data in response to an internal chip selection signal inactivated when the command other than the command requesting the output of the data is received from the external memory controller while discharging the voltages provided to the memory cells.

According to the present technology, a semiconductor device and a method of operating the same, capable of preventing malfunction of the semiconductor device that may occur when a command is received while a read operation is performed are provided.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

Figure 1:
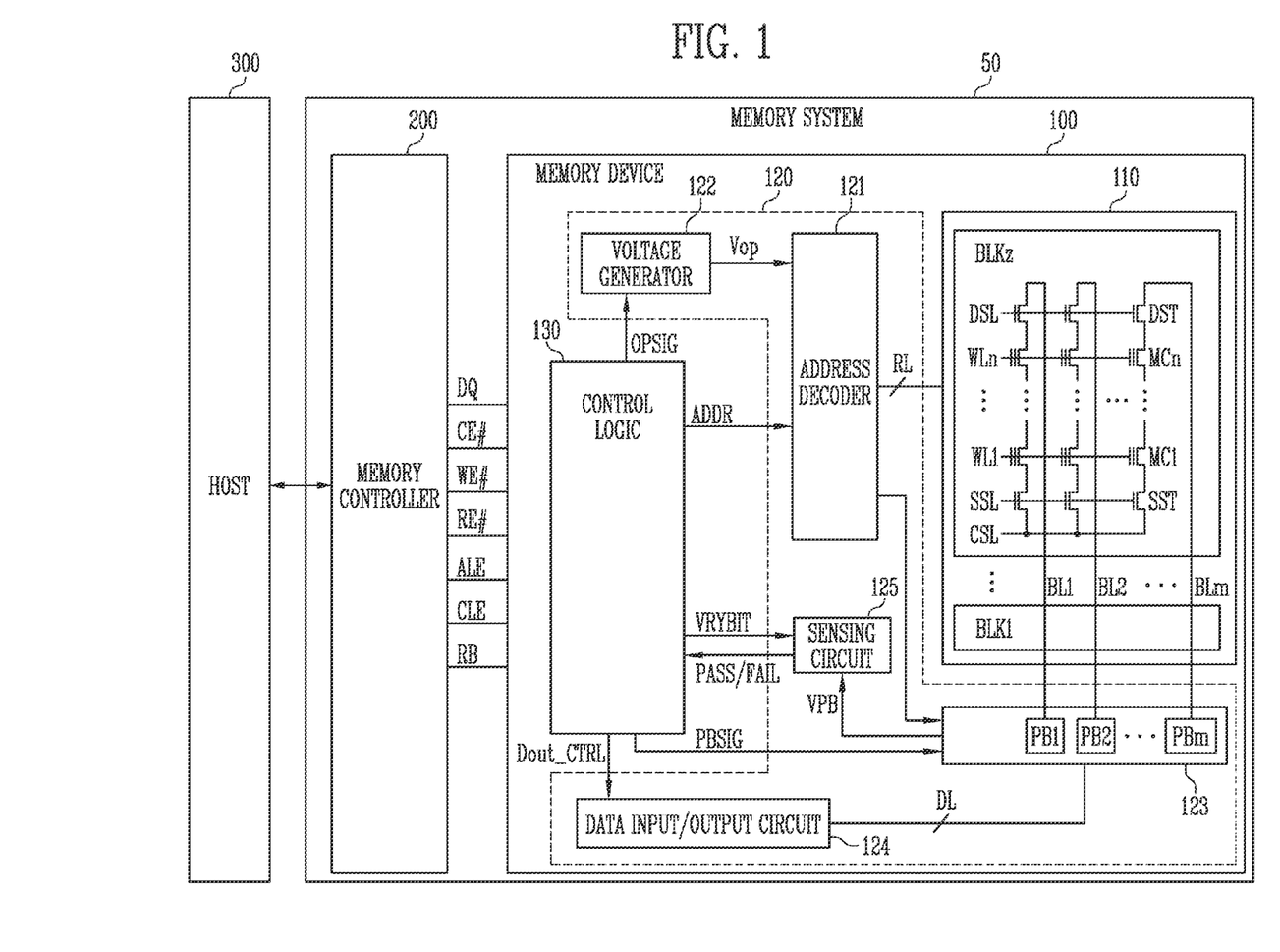
FIG. 1 is a diagram illustrating a memory system including a memory device according to an embodiment of the present disclosure.

FIG. 1 is a diagram illustrating a memory system including a memory device according to an embodiment of the present disclosure.

Referring to FIG. 1, the memory system 50 may include a memory device 100 and a memory controller 200. The memory system 50 may be a device that stores data under control of a host 300 which is an external device. The memory system 50 may be manufactured as any one of various types of storage devices according to a host interface that is a communication method with the host 300. The memory system 50 may be manufactured as any one of various types of packages.

The memory device 100 may store data. The memory device 100 may operate under control of the memory controller 200. In an embodiment, the memory device 100 may be a nonvolatile memory device or a volatile memory device.

The memory device 100 may be configured to receive a command and an address from the memory controller 200 and access an area selected by the address in a memory cell array. The memory device 100 may perform an operation instructed by the command on the area selected by the address. The memory device 100 may perform a program operation (write operation) of storing data in the area selected by the address, a read operation of reading data, or an erase operation of erasing data.

The memory device 100 may communicate with the memory controller 200 through a plurality of input/output lines. In an embodiment, the memory device 100 may communicate with the memory controller 200 through data input/output line DQ and control signal lines including a chip enable line CE #, a write enable line WE #, a read enable line RE #, an address latch enable line ALE, a command latch enable line CLE, and a ready busy line RB.

The memory device 100 may receive a chip selection signal from the memory controller 200 through the chip enable line CE #. The chip selection signal may be a signal for selecting the memory device 100. In an embodiment, the memory controller 200 may select the memory device 100 by outputting an activated chip selection signal through the chip enable line CE #. For example, the activated chip selection signal may be a logic high. When the memory device 100 receives the activated chip selection signal, the memory device 100 may be in a state in which the memory device 100 may communication with the memory controller 200. The memory device 100 receiving an inactivated chip selection signal may be in a standby state in which the memory device 100 does not operate. For example, the inactivated chip selection signal may be a logic low. When the memory device 100 receives the inactivated chip selection signal, the memory device 100 may be in a state in which the memory device 100 does not communicate with the memory controller 200.

The memory device 100 may receive a write enable signal through the write enable line WE #. The write enable signal may be toggled when the command and the address are received to the memory device 100. In an embodiment, the command and the address may be input to the memory device 100 when the write enable signal is changed from a logic high to a logic low.

The memory device 100 may receive a read enable signal from the memory controller 200 through the read enable line RE #. The read enable signal may be toggled when data is output to the memory controller 200. In an embodiment, the data may be output to the memory controller 200 when the read enable signal is changed from a logic high to a logic low.

The memory device 100 may receive an address latch enable signal from the memory controller 200 through the address latch enable line ALE. The address latch enable signal may be a signal for inputting the address. In an embodiment, the address latch enable signal may be a logic high while the address is input to the memory device 100.

The memory device 100 may receive a command latch enable signal from the memory controller 200 through the command latch enable line CLE. The command latch enable signal may be a signal for inputting the command. In an embodiment, the command latch enable signal may be a logic high while the command is input to the memory device 100.

The memory device 100 may receive the command, the address, and the data from the memory controller 200 through the data input/output line DQ. The memory device 100 may output the data to the memory controller 200 through the data input/output line DQ. In an embodiment, the data input/output line DQ may include 8 lines to transmit and receive 8 bits of data, and each data input/output line DQ may transmit and receive 1 bit of data. In another embodiment, the number of data input/output lines DQ may be extended to 16 bits or 32 bits or more.

The memory device 100 may output an outside state signal of a ready state or a busy state to the memory controller 200 through the ready busy line RB. The outside state signal of the ready state may be a state in which the command, the address, or the data may be received from the memory controller 200. The outside state signal of the ready state may be a logic high. The outside state signal of the busy state may be a state in which the command, the address, or the data may not be received from the memory controller 200. The outside state signal of the busy state may be a logic low.

In an embodiment, the memory device 100 may include a memory cell array 110, a peripheral circuit 120, and control logic 130.

The memory cell array 110 may include a plurality of memory blocks BLK1 to BLKz. The plurality of memory blocks BLK1 to BLKz may be connected to an address decoder 121 through row lines RL. The plurality of memory blocks BLK1 to BLKz may be connected to a page buffer group 123 through bit lines BL1 to BLm. Each of the plurality of memory blocks BLK1 to BLKz may include a plurality of memory cells. In an embodiment, the plurality of memory cells may be nonvolatile memory cells. Memory cells connected to the same word line among the plurality of memory cells may be defined as one page.

In an embodiment, any one memory block BLKz among the plurality of memory blocks BLK1 to BLKz may include a plurality of word lines WL1 to WLn arranged parallel to each other between a drain select line DSL and a source select line SSL. The memory block BLKz may include a plurality of memory cell strings connected between any one bit line and a common source line CSL. The bit lines BL1 to BLm may be connected to the plurality of memory cell strings, respectively, and the common source line CSL may be commonly connected to the plurality of memory cell strings.

For example, the memory cell string may include a drain select transistor DST, a plurality of memory cells MC1 to MCn, and a source select transistor SST connected in series between the common source line CSL and a first bit line BL1. One memory cell string may include at least one drain select transistor DST and at least one source select transistor SST.

A drain of the drain select transistor DST may be connected to the first bit line BL1 and a source of the source select transistor SST may be connected to the common source line CSL. The plurality of memory cells MC1 to MCn may be connected in series between the drain select transistor DST and the source select transistor SST. Gates of the source select transistors SST included in different memory cell strings may be connected to the source select line SSL, gates of the drain select transistors DST may be connected to the drain select line DSL, and gates of the plurality of memory cells MC1 to MCn may be connected to the plurality of word lines WL1 to WLn. Among memory cells included in different memory cell strings, memory cells connected to the same word line may be defined as a physical page PG. The memory block BLKz may include physical pages of the number corresponding to the number of the plurality of word lines WL1 to WLn.

Each of the plurality of memory cells MC1 to MCn may be configured as a single-level cell (SLC) that stores one bit of data, a multi-level cell (MLC) that stores two bits of data, a triple-level cell (TLC) that stores three bits of data, a quad-level cell (QLC) capable of storing four bits of data, or memory cells that stores five or more bits of data.

The peripheral circuit 120 may drive the memory cell array 110. For example, the peripheral circuit 120 may drive the memory cell array 110 to perform the program operation, the read operation, and the erase operation. As another example, the peripheral circuit 120 may apply various operating voltages to the row lines RL and the bit lines BL1 to BLm or discharge the applied voltages according to control of the control logic 130.

The peripheral circuit 120 may include the address decoder 121, a voltage generator 122, the page buffer group 123, a data input/output circuit 124, and a sensing circuit 125.

The address decoder 121 is connected to the memory cell array 110 through the row lines RL. The row lines RL may include the drain select lines DSL, the plurality of word lines WL1 to WLn, the source select lines SSL, and the common source line CSL.

The address decoder 121 may be configured to operate in response to the control of the control logic 130. The address decoder 121 may receive an address ADDR from the control logic 130.

The address decoder 121 is configured to decode a block address of the received address ADDR. The address decoder 121 may select at least one memory block among the memory blocks BLK1 to BLKz according to the decoded block address. The address decoder 121 may be configured to decode a row address of the received address ADDR. The address decoder 121 may select at least one word line of the selected memory block by applying voltages provided from the voltage generator 122 to at least one word line WL according to the decoded row address.

During the read operation, the address decoder 121 may apply a read voltage to the selected word line and apply a read pass voltage of a level greater than that of the read voltage to unselected word lines.

The address decoder 121 may be configured to decode a column address of the transferred address ADDR. The decoded column address may be transferred to the page buffer group 123. For example, the address decoder 121 may include components such as a row decoder, a column decoder, and an address buffer.

The voltage generator 122 may be configured to generate a plurality of operation voltages Vop by using an external power voltage supplied to the memory device 100. The voltage generator 122 may operate in response to the control of the control logic 130.

In an embodiment, the voltage generator 122 may generate an internal power voltage by regulating the external power voltage. The internal power voltage generated by the voltage generator 122 may be used as an operation voltage of the memory device 100.

In an embodiment, the voltage generator 122 may generate the various operation voltages Vop used for the program, read, and erase operations in response to an operation signal OPSIG. The voltage generator 122 may generate the plurality of operation voltages Vop using the external power voltage or the internal power voltage. For example, the voltage generator 122 may generate a plurality of erase voltages, a plurality of program voltages, a plurality of pass voltages, a plurality of selection read voltages, and a plurality of non-selection read voltages.

The plurality of generated operation voltages Vop may be supplied to the memory cell array 110 by the address decoder 121.

The page buffer group 123 may include first to m-th page buffers PB1 to PBm. The first to m-th page buffers PB1 to PBm are connected to the memory cell array 110 through first to m-th bit lines BL1 to BLm, respectively. The first to m-th page buffers PB1 to PBm may operate in response to the control of the control logic 130.

The first to m-th page buffers PB1 to PBm may communicate data with the data input/output circuit 124.

During the read operation, the page buffer group 123 may read the data from the memory cells of the selected page through the bit lines BL and store the read data in the first to m-th page buffers PB1 to PBm.

The data input/output circuit 124 may be connected to the first to m-th page buffers PB1 to PBm through the data lines DL. The data input/output circuit 124 may operate in response to the control of the control logic 130.

The data input/output circuit 124 may include a plurality of input/output buffers (not shown) that receive the input data. During the read operation, the data input/output circuit 124 may output the data transferred from the first to m-th page buffers PB1 to PBm included in the page buffer group 123 to the memory controller 200. Specifically, the data input/output circuit 124 may output the data transferred from the first to m-th page buffers PB1 to PBm to the memory controller 200 in response to a data output control signal Dout_CTRL received from the control logic 130.

During the read operation or a verify operation, the sensing circuit 125 may generate a reference current in response to a signal of an allowable bit VRYBIT generated by the control logic 130 and may compare a sensing voltage VPB received from the page buffer group 123 with a reference voltage generated by the reference current to output a pass signal or a fail signal to the control logic 130. For example, the sensing circuit 125 may output the pass signal to the control logic 130 when a magnitude of the sensing voltage VPB is less than the reference voltage. As another example, the sensing circuit 125 may output the fail signal to the control logic 130 when the magnitude of the sensing voltage VPB is greater than the reference voltage.

The control logic 130 may be connected to the address decoder 121, the voltage generator 122, the page buffer group 123, the data input/output circuit 124, and the sensing circuit 125. The control logic 130 may be configured to control all operations of the memory device 100. The control logic 130 may operate in response to a command transferred from the memory controller 200. The control logic 130 may be implemented as hardware, software, or a combination of hardware and software. For example, the control logic 130 may be a control logic circuit operating in accordance with an algorithm and/or a processor executing control logic code.

The control logic 130 may generate various signals in response to the command and the address to control the peripheral circuit 120. For example, the control logic 130 may generate the operation signal OPSIG, the address ADDR, a page buffer control signal PBSIG, and the allowable bit VRYBIT in response to the command and the address received through the data input/output line DQ. The control logic 130 may output the operation signal OPSIG to the voltage generator 122, output the address ADDR to the address decoder 121, output the page buffer control signal PBSIG to the page buffer group 123, output the allowable bit VRYBIT to the sensing circuit 125, and output the data output control signal Dout_CTRL to the data input/output circuit 124. In an embodiment, the control logic 130 may control to transfer data stored in the first to m-th page buffers PB1 to PBm to the data input/output circuit 124 through the page buffer control signal PBSIG. In an embodiment, the control logic 130 may provide the data output control signal Dout_CTRL to the data input/output circuit 124 in response to a data output command provided from the memory controller 200. In an embodiment, the control logic 130 may control the data input/output circuit 124 to provide data transferred to the data input/output circuit 124 to the memory controller 200 through the data output control signal Dout_CTRL.

The memory controller 200 may control an overall operation of the memory system 50.

When power is applied to the memory system 50, the memory controller 200 may execute firmware (FW). When the memory device 100 is a flash memory device, the firmware (FW) may include host interface layer (HIL) controlling communication with the host 300, a flash translation layer (FTL) controlling communication between the host 300 and the memory device 100, and a flash interface layer (FIL) controlling communication with the memory device 100.

The memory controller 200 may control the memory device 100 to perform the write operation, the read operation, the erase operation, or the like according to a request of the host 300. The memory controller 200 may provide the command, the physical address, or the data to the memory device 100 according to the write operation, the read operation, or the erase operation.

In an embodiment, the memory controller 200 may generate the command, the address, and the data and transmit the command, the address, and the data to the memory device 100 independently regardless of the request from the host 300. For example, the memory controller 200 may provide the command, the address, and the data for performing the read operation and the write operations involved in performing wear leveling, read reclaim, garbage collection, and the like, to the memory device 100.

The host 300 may communicate with the memory system 50 using various communication methods.

In an embodiment, the memory system 50 may include a buffer memory (not shown). For example, the buffer memory may temporarily store data received from the host 300 or data received from the memory device 100, or temporarily store meta data (for example, a mapping table) of the memory device 100. The buffer memory may be a volatile memory or a nonvolatile memory.

Figure 2:
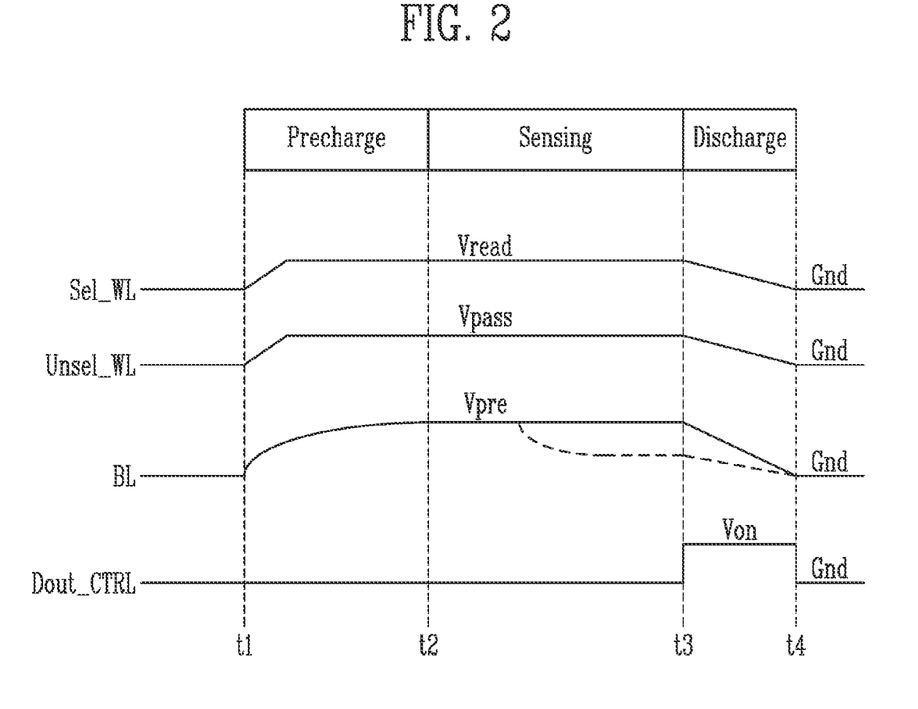
FIG. 2 is a diagram illustrating a high-speed read operation of the memory device.

FIG. 2 is a diagram illustrating a high-speed read operation of the memory device.

Referring to FIG. 2, the memory device 100 may perform the high-speed read operation. The high-speed read operation may be an operation of applying voltages to the word line and the bit line connected to the memory cells to sense data stored in the memory cells and discharging the voltages applied to the word line and the bit line while outputting the sensed data to the memory controller.

The high-speed read operation may include a precharge period Precharge, a sensing period Sensing, and a discharge period Discharge.

A period t1 to t2 may be the precharge period Precharge. The precharge period Precharge may be a period in which the voltage of the plurality of word lines and the bit line is precharged. In the period t1 to t2, the memory device 100 may apply a read voltage Vread to a selected word line Sel_WL. In the period t1 to t2, the memory device 100 may apply a pass voltage Vpass to unselected word lines Unsel_WL. A magnitude of the pass voltage Vpass may be greater than that of the read voltage Vread. In the period t1 to t2, the memory device 100 may apply a precharge voltage Vpre to the bit line BL.

A period t2 to t3 may be the sensing period Sensing. The sensing period Sensing may be a period in which the data stored in the selected memory cells is sensed by sensing the voltage of the bit line that changes based on a threshold voltage of the selected memory cells. In an embodiment, a voltage of a bit line connected to a memory cell having a threshold voltage higher than the read voltage Vread may be maintained as the precharge voltage Vpre. In another embodiment, a voltage of a bit line connected to a memory cell having a threshold voltage lower than the read voltage Vread may be decreased to a voltage lower than the precharge voltage Vpre. The memory device 100 may sense the data stored in the selected memory cells according to the threshold voltage of the selected memory cells in the sensing period Sensing. The memory device 100 may temporarily store the sensed data in a page buffer.

A period t3 to t4 may be the discharge period Discharge. The discharge period Discharge may be a period in which the voltages provided to the plurality of word lines and the bit line are discharged. In the period t3 to t4, the voltage of the selected word line Sel_WL may be decreased to a ground voltage Gnd. In the period t3 to t4, the voltage of the unselected word lines Unsel_WL may be decreased to the ground voltage Gnd. In the period t3 to t4, the voltage of the bit line BL may be decreased to the ground voltage Gnd.

In the period t3 to t4, the memory device 100 may transfer the data sensed from the selected memory cells to the data input/output circuit 124, and the data input/output circuit 124 may output the sensed data to the memory controller 200. Specifically, the data input/output circuit 124 may output the sensed data to the memory controller 200 in response to the data output control signal Dout_CTRL received from the control logic 130. That is, the memory device 100 may output the data sensed from the selected memory cells to the memory controller 200 while discharging the voltage of the selected word line Sel_WL, the unselected word lines Unsel_WL, and the bit line BL.

Figure 3:
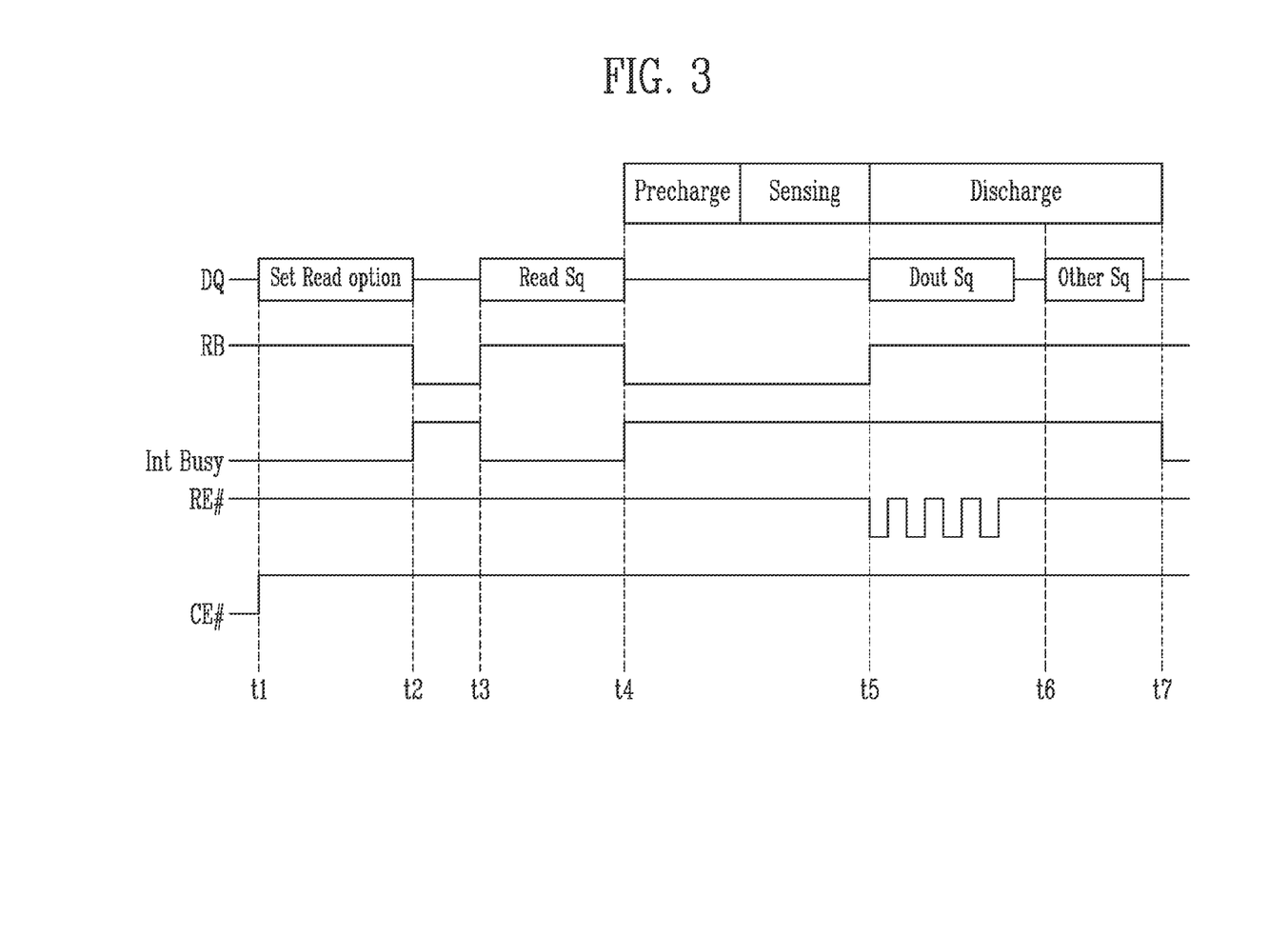
FIG. 3 is a diagram illustrating a case where another command is input while the high-speed read operation is performed.

FIG. 3 is a diagram illustrating a case where another command is input while the high-speed read operation is performed.

Referring to FIG. 3, the data input/output line DQ, the ready busy line RB, an internal state signal Int Busy, the read enable line RE #, and the chip enable line CE # are shown.

The memory device 100 may receive the command, the address, and the data or output the data through the data input/output line DQ. The memory device 100 may output an external state signal of a ready state or an external state signal of a busy state through the ready busy line RB. The external state signal of the ready state may be a logic high. The external state signal of the busy state may be a logic low.

The internal state signal may be a signal indicating an operation state of the memory device 100. For example, the memory device 100 may output an internal state signal of a busy state while performing the high-speed read operation. The internal state signal of the busy state may be a logic high. As another example, the memory device 100 may output an internal state signal of a ready state while the memory device 100 is in a standby state in which the memory device 100 does not perform any operation. The internal state signal of the ready state may be a logic low.

The period t1 to t2 may be a period for setting a parameter for the high-speed read operation. In the period t1 to t2, the memory device 100 may receive a parameter command sequence Set Read option through the data input/output line DQ. For example, a command sequence input through the data input/output line DQ may be "EFh-F5h-P0<1>=1". In the period t1 to t2, the memory device 100 may receive the activated chip selection signal through the chip enable line CE #. The activated chip selection signal may be a logic high.

The period t2 to t3 may be a period in which an operation corresponding to the received parameter command sequence is performed. In the period t2 to t3, the memory device 100 may output the external state signal of the busy state to the memory controller. The memory device 100 may output the internal state signal of the busy state.

The period t3 to t4 may be a period for receiving a command sequence for the high-speed read operation. The memory device 100 may receive a read command sequence Read Sq through the data input/output line DQ. For example, the read command sequence Read Sq may be "00h-Add-30h". In the period t3 to t4, the memory device 100 may output the external state signal of the ready state. The memory device 100 may output the internal state signal of the ready state.

A period t4 to t7 may be a period in which the memory device 100 performs the high-speed read operation. In the period t4 to t7, since the memory device 100 is performing the high-speed read operation, the memory device 100 may output the internal state signal of the busy state.

Specifically, the period t4 to t5 may be the precharge period Precharge and the sensing period Sensing included in the high-speed read operation. In the period t4 to t5, the memory device 100 may output the external state signal of the busy state.

A period t5 to t7 may be the discharge period included in the high-speed read operation. In the period t5 to t7, the memory device 100 may discharge the voltages applied to the word line or the bit line connected to the memory cells while outputting the data sensed from the memory cells to the memory controller 200. In the period t5 to t7, the memory device 100 may output the external state signal of the ready state to receive the data output command sequence Dout Sq.

In a period t5 to t6, the memory device 100 may output the data sensed from the memory cells in response to the data output command sequence Dout Sq received through the data input/output line DQ. For example, the data output command sequence Dout Sq may be "12h-A0h-27h". In the period t5 to t6, the data sensed from the memory cells may be output to the memory controller 200 by toggling the read enable signal input through the read enable line RE #. The data sensed from the memory cells may be output to the memory controller 200 when the read enable signal is toggled from a logic high to a logic low or from a logic low to a logic high.

In a period t6 to t7, since the memory device 100 outputs the external state signal of the ready state, a command other than a command requesting a data output may be received through the data input/output line DQ. However, in the period t6 to t7, since the memory device 100 is performing the operation of discharging the voltages provided to the memory cells, when the command other than the command requesting the data output is received, the memory device 100 may malfunction.

Figure 4:
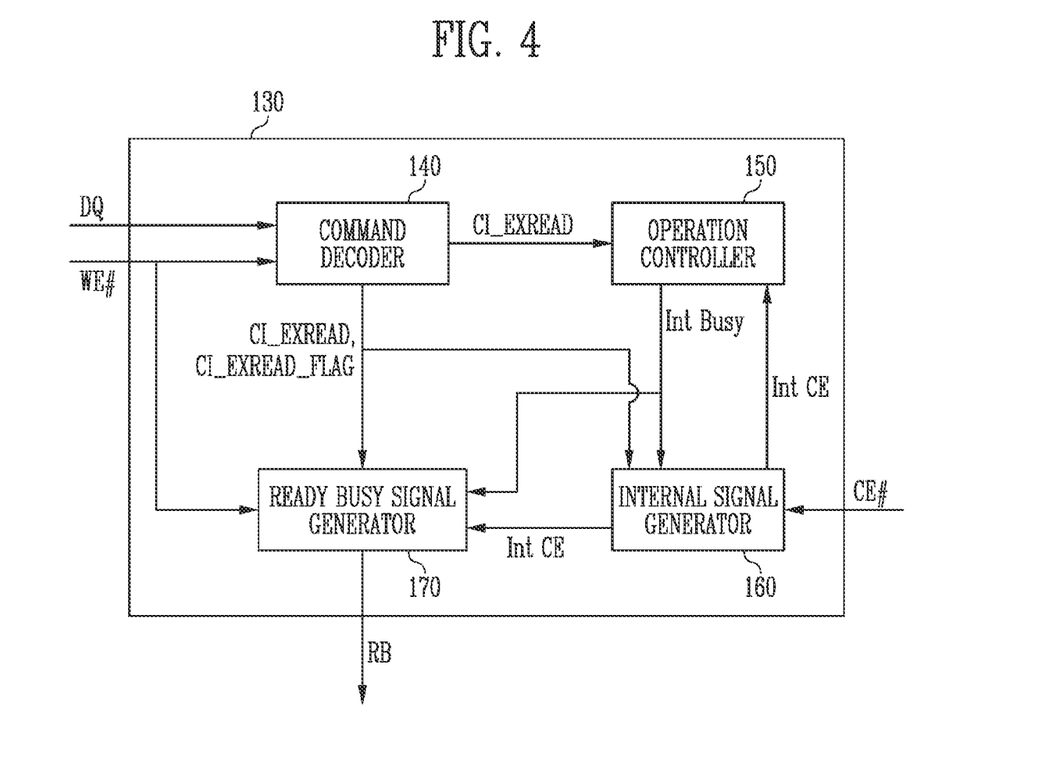
FIG. 4 is a diagram illustrating a high-speed read operation of a memory device according to an embodiment of the present disclosure.

FIG. 4 is a diagram illustrating a high-speed read operation of a memory device according to an embodiment of the present disclosure.

Referring to FIG. 4, the control logic 130 shown in FIG. 1 may include a command decoder 140, an operation controller 150, an internal signal generator 160, and a ready busy signal generator 170. The control logic 130 may be connected to the chip enable line CE #. The control logic 130 may receive the chip selection signal through the chip enable line CE #. In an embodiment, the control logic 130 may include a chip selection signal receiver capable of receiving the chip selection signal. In an embodiment, the chip enable line CE # may be the chip selection signal receiver.

The control logic 130 may be connected to the data input/output line DQ. The control logic 130 may receive the command, the address, or the data through the data input/output line DQ. In an embodiment, the control logic 130 may include a data signal receiver capable of receiving the command, the address, or the data. In an embodiment, the data input/output line DQ may be the data signal receiver. The control logic 130 may be connected to the write enable line WE #.

Specifically, the command decoder 140 may be connected to the data input/output line DQ and the write enable line WE #. The command decoder 140 may receive the read command sequence or the data output command sequence through the data input/output line DQ. The command decoder 140 may output a high-speed read operation signal CI_EXREAD and a high-speed read control signal CI_EXREAD_FLAG in response to a high-speed read command input through the data input/output line DQ.

The operation controller 150 may perform the high-speed read operation in response to the high-speed read operation signal CI_EXREAD output from the command decoder 140. The operation controller 150 may output the internal state signal Int Busy. In an embodiment, the operation controller 150 may output the internal state signal of the busy state while performing the high-speed read operation. In another embodiment, the operation controller 150 may output the internal state signal of the ready state when the high-speed read operation has ended.

The internal signal generator 160 may receive the chip selection signal through the chip enable line CE #. The internal signal generator 160 may output an internal chip selection signal Int CE in response to the chip selection signal, the high-speed read operation signal CI_EXREAD, the high-speed read control signal CI_EXREAD_FLAG, and the internal state signal Int Busy. The ready busy signal generator 170 may receive the write enable signal through the write enable line WE #. The ready busy signal generator 170 may output the external state signal RB to the memory controller 200 in response to the write enable signal, the high-speed read operation signal CI_EXREAD, the high-speed read control signal CI_EXREAD_FLAG, the internal state signal Int Busy, and the internal chip selection signal Int CE.

In an embodiment, when the command decoder 140 receives the command other than the command requesting the data output through the data input/output line DQ while discharging the voltages provided to the memory cells, the command decoder 140 may provide an inactivated high-speed read operation signal to the internal signal generator 160. The internal signal generator 160 may output an inactivated internal chip selection signal to the operation controller 150 in response to the inactivated high-speed read operation signal and the internal state signal of the busy state. That is, the internal signal generator 160 may receive the activated chip selection signal and provide the inactivated internal chip selection signal to the operation controller 150, thereby blocking supply of the activated chip selection signal to the operation controller 150. The internal signal generator 160 may provide the inactivated internal chip selection signal to the ready busy signal generator 170.

In an embodiment, the ready busy signal generator 170 may output the external state signal of the busy state to the memory controller 200 in response to the inactivated internal chip selection signal, the inactivated high-speed read operation signal, and the internal state signal of the busy state. The ready busy signal generator 170 may output the external state signal of the busy state to the memory controller 200 when the command other than the command requesting the data output is input while discharging the voltages provided to the memory cells to inform that the memory device 100 is internally operating.

Figure 5:
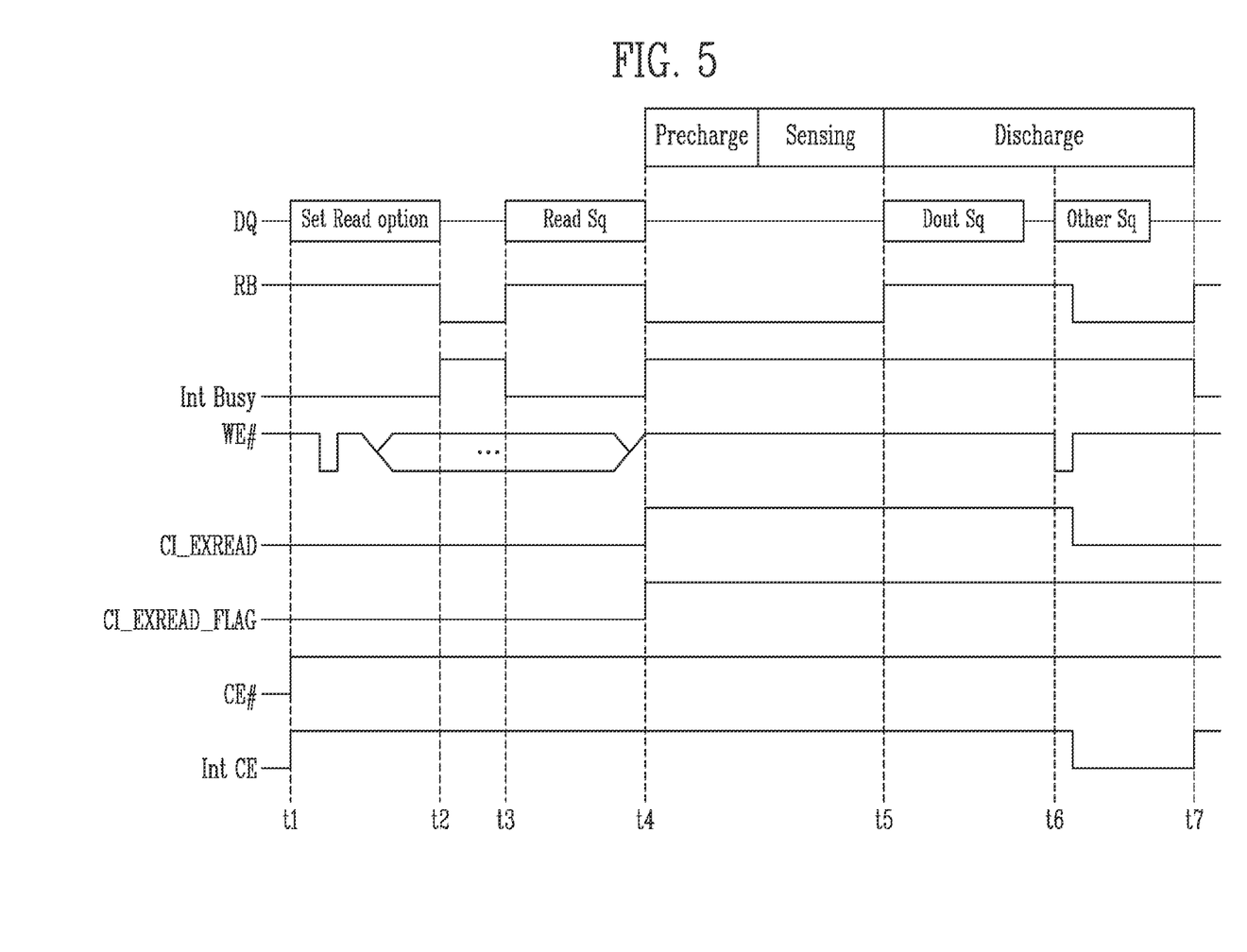
FIG. 5 is a diagram illustrating an operation of blocking another command input while the high-speed read operation is performed.

FIG. 5 is a diagram illustrating an operation of blocking another command input while the high-speed read operation is performed.

In FIG. 5, content overlapping that of FIG. 3 is omitted.

Referring to FIG. 5, the memory device 100 may perform the high-speed read operation after receiving the read command sequence Read Sq through the data input/output line DQ. At time t4, the high-speed read operation signal CI_EXREAD and the high-speed read control signal CI_EXREAD_FLAG may be activated. At time t4, the high-speed read operation signal CI_EXREAD and the high-speed read control signal CI_EXREAD_FLAG may be changed from a logic low to a logic high.

The period t5 to t7 may be the discharge period Discharge included in the high-speed read operation. In the period t5 to t7, the memory device 100 may discharge the voltages applied to the word line or the bit line connected to the memory cells while outputting the data sensed from the memory cells to the memory controller 200.

In the period t5 to t7, since the memory device 100 is performing the high-speed read operation, the memory device 100 may output the internal state signal of the busy state. The internal state signal of the busy state may be a logic high.

In the period t6 to t7, the memory device 100 may receive the command other than the command requesting the data output through the data input/output line DQ. When the command other than the command requesting the data output is input, the write enable signal received through the write enable line WE # may be toggled. When the write enable signal is toggled, the high-speed read operation signal CI_EXREAD may be inactivated. Specifically, the high-speed read operation signal CI_EXREAD may be changed from a logic high to a logic low. In an embodiment, the command decoder 140 may output an inactivated high-speed read operation signal CI_EXREAD when the command other than the command requesting the data output is input.

When the high-speed read operation signal CI_EXREAD is inactivated, the internal chip selection signal Int CE may be inactivated. Specifically, the internal chip selection signal Int CE may be changed from a logic high to a logic low. In an embodiment, the internal signal generator 160 may output the inactivated internal chip selection signal in response to the inactivated high-speed read operation signal and the internal state signal of the busy state.

When the internal chip selection signal Int CE is inactivated, the external state signal RB may be changed from a ready state to a busy state. Specifically, the external state signal RB may be changed from a logic high to a logic low. In an embodiment, the ready busy signal generator 170 may output the external state signal of the busy state to the memory controller 200 in response to the inactivated high-speed read operation signal, the inactivated internal chip selection signal, and the internal state signal of the busy state.

At time t7, the high-speed read operation may be ended. When the high-speed read operation has ended, the internal state signal Int Busy may be changed from the busy state to the ready state. Specifically, the internal state signal Int Busy may be changed from a logic high to a logic low. In an embodiment, the operation controller 150 may output the internal state signal of the ready state when the high-speed read operation has ended.

When the internal state signal Int Busy is changed to the ready state, the inactivated internal chip selection signal may be activated. Specifically, the internal chip selection signal Int CE may be changed from a logic low to a logic high. In an embodiment, the internal signal generator 160 may output the activated internal chip selection signal in response to the internal state signal of the ready state output when the high-speed read operation has ended.

When the internal chip selection signal Int Busy is activated, the external state signal RB may be changed from the busy state to the ready state. Specifically, the external state signal may be changed from a logic low to a logic high. In an embodiment, the ready busy signal generator 170 may output the external state signal of the ready state to the memory controller 200 in response to the activated internal chip selection signal and the internal state signal of the ready state.

Figure 6:
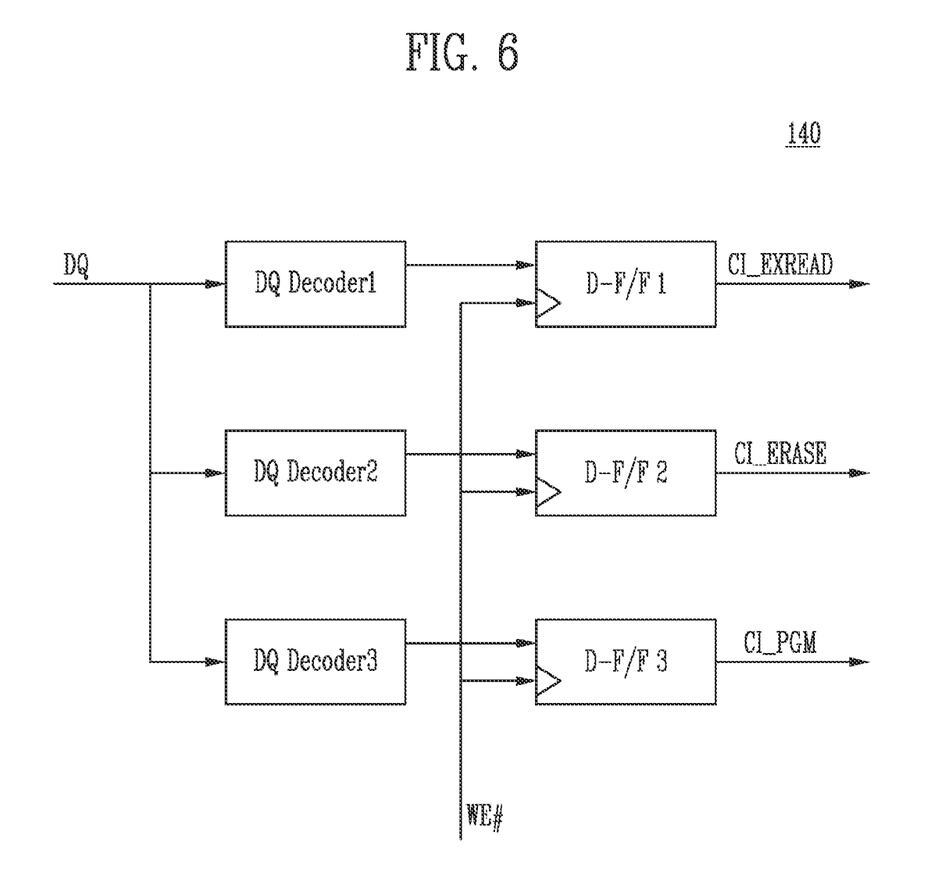
FIG. 6 is a diagram illustrating a command decoder.

FIG. 6 is a diagram illustrating the command decoder.

Referring to FIG. 6, the command decoder 140 may be connected to the data input/output line DQ and the write enable line WE #. The command decoder 140 may receive the command, the address, or the data through the data input/output line DQ. The command decoder 140 may include first to third DQ decoders DQ Decoder1 to DQ Decoder3 and first to third D-flip-flops D-F/F 1 to D-F/F 3. The first to third DQ decoders DQ Decoder1 to DQ Decoder3 may be connected to the data input/output line DQ. The first to third D-flip-flops D-F/F 1 to D-F/F 3 may be connected to the write enable line WE #. The first to third D-flip-flops D-F/F 1 to D-F/F 3 may receive an activated write enable signal through the write enable line WE #.

The first DQ decoder DQ Decoder1 and the first D-flip-flop D-F/F 1 may be configurations related to the high-speed read operation. The second DQ decoder DQ Decoder2 and the second D-flip-flop D-F/F 2 may be configurations related to the erase operation. The third DQ decoder DQ Decoder3 and the third D-flip-flop D-F/F3 may be configurations related to the program operation.

In an embodiment, the first DQ decoder DQ Decoder1 may provide a signal activated when a high-speed read command corresponding to the high-speed read operation is input through the data input/output line DQ to the first D-flip-flop D-F/F1. The first D-flip-flop D-F/F 1 may output the high-speed read operation signal CI_EXREAD in response to the signal provided from the first DQ decoder DQ Decoder1. The second and third DQ decoders DQ Decoder2 and DQ Decoder3 may not output a signal to the second and third D-flip-flops D-F/F 2 and D-F/F 3 when the high-speed read command is input.

In an embodiment, the first DQ decoder DQ Decoder1 may not output the signal to the first D-flip-flop D-F/F1 when the command other than the command requesting the data output is input through the data input/output line DQ. In addition, the write enable signal received through the write enable line WE # may be toggled when the command other than the command requesting the data output is input. When the write enable signal is toggled, the first D-flip-flop D-F/F 1 may output the inactivated high-speed read operation signal.

Figure 7:
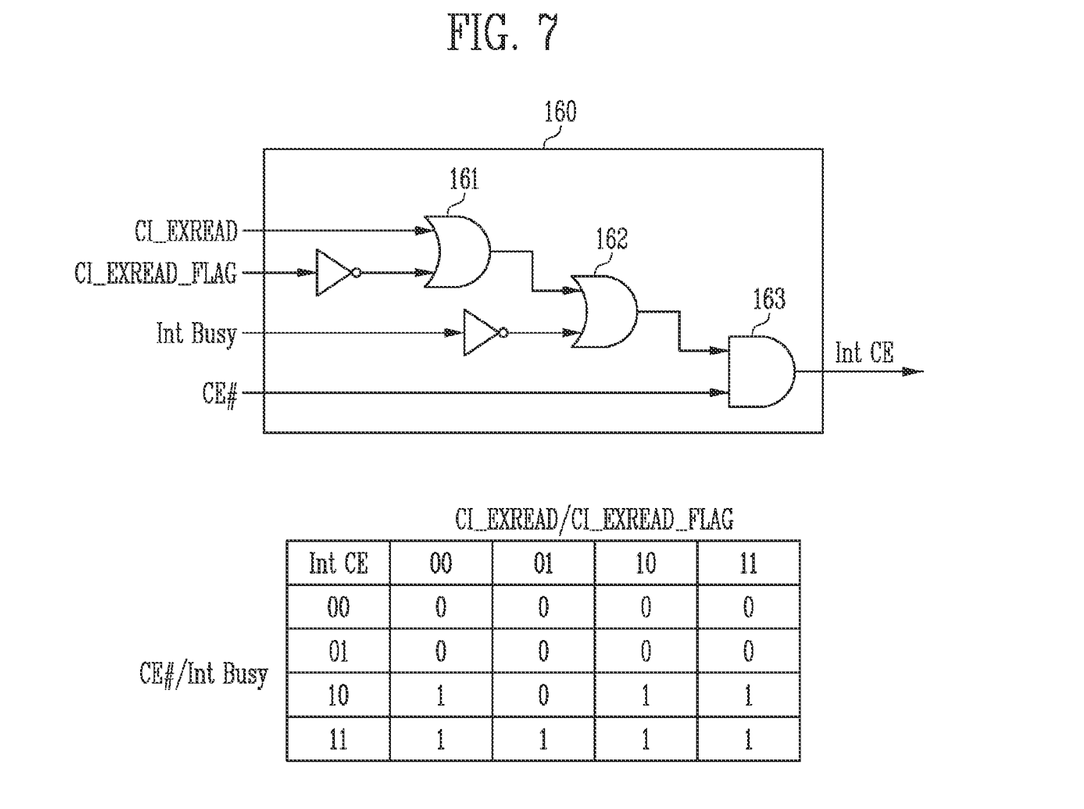
FIG. 7 is a diagram illustrating an internal signal generator.

FIG. 7 is a diagram illustrating the internal signal generator.

Referring to FIG. 7, the internal signal generator 160 may be connected to the chip enable line CE #. The internal signal generator 160 may output the internal chip selection signal Int CE in response to the high-speed read operation signal CI_EXREAD, the high-speed read control signal CI_EXREAD_FLAG, the internal state signal Int Busy, and the chip selection signal.

The internal signal generator 160 may be configured to include logic circuits, as shown in FIG. 7. The high-speed read operation signal CI_EXREAD and the high-speed read control signal CI_EXREAD_FLAG inverted through an inverter may be input to a first OR gate 161. A signal output from the first OR gate 161 and the internal state signal Int Busy inverted through the inverter may be input to a second OR gate 162. A signal output from the second OR gate 162 and the chip selection signal input through the chip enable line CE # may be input to an AND gate 163. The AND gate 163 may output the internal chip selection signal Int CE.

In an embodiment, the internal signal generator 160 may receive the inactivated high-speed read operation signal and the activated high-speed read control signal when the command other than the command requesting the data output is input while the high-speed read operation is performed. The inactivated high-speed read operation signal may be a logic value of 0. The activated high-speed read control signal may be a logic value of 1. The first OR gate 161 may output an inactivated signal in response to the inactivated high-speed read operation signal and the activated high-speed read control signal. The inactivated signal may be a logic value of 0. The second OR gate 162 may output an inactivated signal in response to the inactivated signal and the internal state signal of the busy state. The AND gate 163 may output the inactivated internal chip selection signal in response to the inactivated signal and the activated chip selection signal. The inactivated internal chip selection signal may be a logic value of 0.

In an embodiment, the internal signal generator 160 may output the inactivated internal chip selection signal in response to the inactivated high-speed read operation signal, the activated high-speed read control signal, the internal state signal of the busy state, and the activated chip selection signal.

In an embodiment, the internal signal generator 160 may output the activated internal chip selection signal in response to the inactivated high-speed read operation signal, the activated high-speed read control signal, the internal state signal of the ready state, and the activated chip selection signal.

Figure 8:
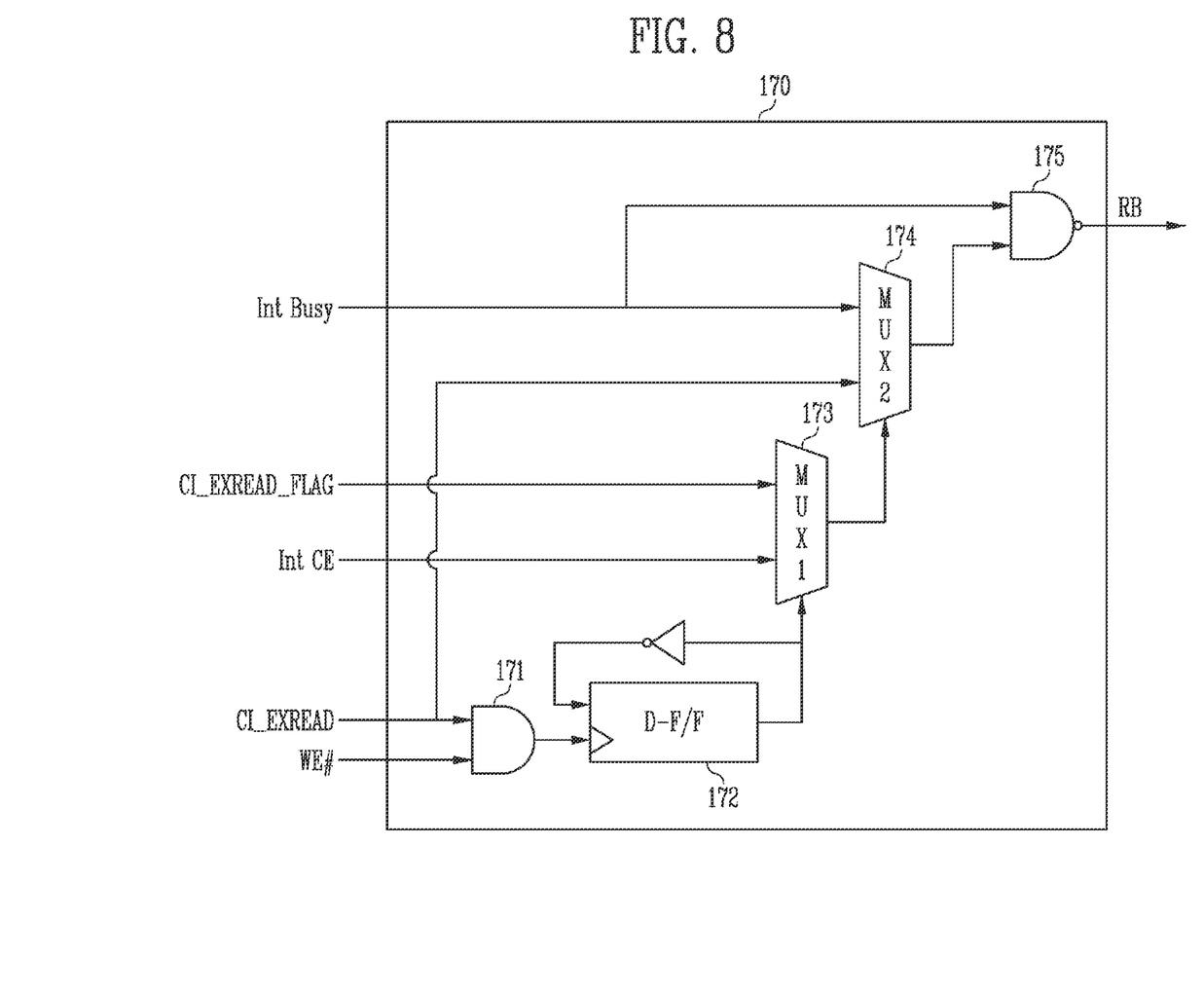
FIG. 8 is a diagram illustrating a ready busy signal generator.

FIG. 8 is a diagram illustrating the ready busy signal generator.

Referring to FIG. 8, the ready busy signal generator 170 may be connected to the write enable line WE #. The ready busy signal generator may output the external state signal RB in response to the high-speed read operation signal CI_EXREAD, the high-speed read control signal CI_EXREAD_FLAG, the internal state signal Int Busy, the internal chip selection signal Int CE, and the write enable signal.

The ready busy signal generator 170 may be configured of a logic circuit as shown in FIG. 8. The high-speed read operation signal CI_EXREAD and the write enable line WE # may be connected to an AND gate 171. A signal output from the AND gate 171 may be connected to a D-flip-flop 172. The high-speed read control signal CI_EXREAD_FLAG, the internal chip selection signal, and a signal output from the D flip-flop 172 may be connected to a first multiplexer 173. The internal state signal Int Busy, the high-speed read operation signal CI_EXREAD, and a signal output from the first multiplexer 173 may be connected to a second multiplexer 174. The internal state signal Int Busy and a signal output from the second multiplexer 174 may be connected to a NAND gate 175. The NAND gate 175 may output the external state signal RB.

In an embodiment, the ready busy signal generator 170 may output the external state signal of the busy state in response to the inactivated high-speed read operation signal, the inactivated internal chip selection signal, and the internal state signal of the busy state when the command other than the command requesting the data output is input while the high-speed read operation is performed.

In an embodiment, the ready busy signal generator 170 may output the external state signal of the ready state in response to the activated internal chip selection signal and the internal state signal of the ready state after the high-speed read operation has ended.

Figure 9:
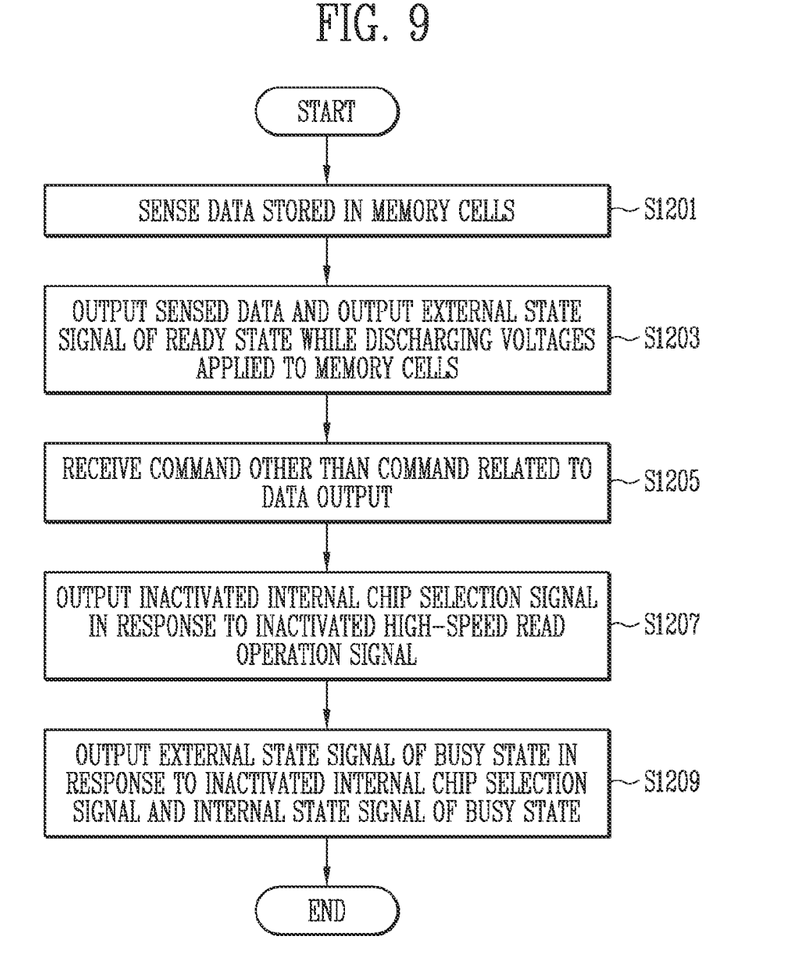
FIG. 9 is a flowchart illustrating a high-speed read operation according to an embodiment of the present disclosure.

FIG. 9 is a flowchart illustrating a high-speed read operation according to an embodiment of the present disclosure.

Referring to FIG. 9, in step S1201, the memory device 100 may sense the data stored in the memory cells.

In step S1203, the memory device 100 may discharge the voltages provided to the memory cells while outputting the sensed data. The memory device 100 may output the external state signal of the ready state to the memory controller 200 while discharging the voltages provided to the memory cells.

In step S1205, the memory device 100 may receive the command other than the command related to the data output while discharging the voltages applied to the memory cells.

In step S1207, the memory device 100 may output the inactivated internal chip selection signal in response to the inactivated high-speed read operation signal. The high-speed read operation signal may be inactivated in response to receiving the command other than the command related to the data output. In an embodiment, the internal signal generator 160 may block transferal of the chip selection signal to the operation controller 150 by providing the inactivated internal chip selection signal to the operation controller 150.

In step S1209, the memory device 100 may output the external state signal of the busy state to the memory controller 200 in response to the inactivated internal chip selection signal and the internal state signal of the busy state.

What is claimed is:

1. A semiconductor device comprising:
   a chip selection signal receiver configured to receive, from an external memory controller, a chip selection signal activating to a state in which communication is possible with the external memory controller;
   a data signal receiver configured to receive a command and an address from the external memory controller;
   an operation controller configured to perform an internal operation according to the command and the address received through the data signal receiver while the chip selection signal is input; and
   an internal signal generator configured to output an inactivated internal chip selection signal blocking transferal of the chip selection signal to the operation controller when a command other than a command requesting an output of data is received while the internal operation is performed.

2. The semiconductor device of claim 1, wherein the internal operation is an operation of discharging voltages provided to memory cells while outputting data sensed from the memory cells to the external memory controller.

3. The semiconductor device of claim 2, further comprising:
   a command decoder configured to output a high-speed read operation signal and a high-speed read control signal in response to a write enable signal and the command received from the external memory controller.

4. The semiconductor device of claim 3, wherein the operation controller outputs an internal state signal indicating whether the internal operation is being performed, and the internal signal generator outputs the internal chip selection signal in response to the chip selection signal, the high-speed read operation signal, the high-speed read control signal, and the internal state signal.

5. The semiconductor device of claim 4, wherein the command decoder outputs an inactivated high-speed read operation signal when the command other than the command requesting the output of the data is input while discharging the voltages provided to the memory cells.

6. The semiconductor device of claim 5, wherein the internal signal generator outputs the inactivated internal chip selection signal in response to the inactivated high-speed read operation signal and an internal state signal of a busy state.

7. The semiconductor device of claim 6, further comprising:
   a ready busy signal generator configured to output an external state signal to the external memory controller in response to the internal chip selection signal and the internal state signal.

8. The semiconductor device of claim 7, wherein the ready busy signal generator outputs an external state signal of a ready state before when the command other than the command requesting the output of the data is input while discharging the voltages provided to the memory cells.

9. The semiconductor device of claim 7, wherein the ready busy signal generator outputs an external state signal of a busy state to the external memory controller in response to the inactivated internal chip selection signal and the internal state signal of the busy state.

10. The semiconductor device of claim 7, wherein the internal signal generator outputs an activated internal chip selection signal in response to an internal state signal of a ready state output when the internal operation has ended.

11. The semiconductor device of claim 10, wherein the ready busy signal generator outputs an external state signal of a ready state to the external memory controller in response to the activated internal chip selection signal and the internal state signal of the ready state.

12. The semiconductor device of claim 2, wherein the voltages provided to the memory cells are voltages provided to word lines or bit lines connected to the memory cells.

13. A method of operating a semiconductor device, the method comprising:
    receiving, from an external memory controller, a chip selection signal activating to a state in which communication is possible with the external memory controller;
    receiving a command and an address from the external memory controller;
    performing an internal operation according to the command and the address while the chip selection signal is input; and
    outputting an inactivated internal chip selection signal blocking transferal of the chip selection signal to an operation controller performing the internal operation when a command other than a command requesting an output of data is received while the internal operation is performed.

14. The method of claim 13, wherein the internal operation is an operation of discharging voltages provided to memory cells while outputting data sensed from the memory cells to the external memory controller.

15. The method of claim 14, wherein receiving the command and the address comprises:
    outputting a high-speed read operation signal and a high-speed read control signal in response to a write enable signal and the command received from the external memory controller; and
    outputting an inactivated high-speed read operation signal when the command other than the command requesting the output of the data is input while discharging the voltages provided to the memory cells.

16. The method of claim 15, wherein outputting the inactivated internal chip selection signal comprises outputting the inactivated internal chip selection signal in response to the inactivated high-speed read operation signal and an internal state signal of a busy state output while the internal operation is performed.

17. The method of claim 16, wherein an external state signal of a busy state is output in response to the inactivated internal chip selection signal and the internal state signal of the busy state.

18. The method of claim 16, wherein an activated internal chip selection signal is output in response to an internal state signal of a ready state output when the internal operation has ended.

19. A semiconductor device comprising:
    memory cells;
    a peripheral circuit configured to perform a high-speed read operation of sensing data stored in the memory cells and discharging voltages provided to the memory cells while outputting the data to an external memory controller; and
    control logic configured to ignore a command other than a command requesting an output of the data in response to an internal chip selection signal inactivated when the command other than the command requesting the output of the data is received from the external memory controller while discharging the voltages provided to the memory cells.

20. The semiconductor device of claim 19, wherein the control logic further comprises a ready busy signal generator configured to output an external state signal of a busy state to the external memory controller in response to the inactivated internal chip selection signal and an internal state signal of a busy state output while the high-speed read operation is performed.

* * * * *